United States Patent
Nelson

(10) Patent No.: US 11,313,481 B2
(45) Date of Patent: Apr. 26, 2022

(54) SYSTEMS FOR RUPTURING A VACUUM IN A MEDICAL IMAGING DEVICE

(71) Applicant: GE Precision Healthcare LLC, Wauwatosa, WI (US)

(72) Inventor: David A. Nelson, Florence, SC (US)

(73) Assignee: GE Precision Healthcare LLC, Wauwatosa, WI (US)

( * ) Notice: Subject to any disclaimer, the term of this patent is extended or adjusted under 35 U.S.C. 154(b) by 504 days.

(21) Appl. No.: 16/553,844

(22) Filed: Aug. 28, 2019

(65) Prior Publication Data

US 2021/0062925 A1    Mar. 4, 2021

(51) Int. Cl.
G01R 33/32    (2006.01)
F16K 17/40    (2006.01)
G01R 33/28    (2006.01)
G01R 33/38    (2006.01)

(52) U.S. Cl.
CPC ............ *F16K 13/04* (2013.01); *G01R 33/288* (2013.01); *G01R 33/3804* (2013.01)

(58) Field of Classification Search
CPC ... H01F 6/02; H01F 6/04; F16K 13/04; G01R 33/288; G01R 33/3804
USPC ...................................................... 137/68.3
See application file for complete search history.

(56) References Cited

U.S. PATENT DOCUMENTS

| | | | | |
|---|---|---|---|---|
| 1,879,382 A | * | 9/1932 | Marr | F16K 13/04 222/5 |
| 3,633,596 A | * | 1/1972 | Gerber | F16K 13/04 222/5 |
| 4,739,799 A | * | 4/1988 | Carney | F16K 13/04 137/67 |
| 2014/0018243 A1 | * | 1/2014 | Gross | G01R 33/34023 324/322 |
| 2015/0027559 A1 | * | 1/2015 | Retz | F16K 17/16 137/68.19 |
| 2017/0205124 A1 | * | 7/2017 | Staines | F25D 19/00 |

OTHER PUBLICATIONS

GE Healthcare Service Shop. Emergency Evacuation Release Tool, part No. 46-260852. Accessed from https://services.gehealthcare.com/gehcstorefront/p/46-260852G3?index=1 on Aug. 2, 2019.

* cited by examiner

*Primary Examiner* — P. Macade Nichols
(74) *Attorney, Agent, or Firm* — Andrus Intellectual Property Law, LLP

(57) ABSTRACT

A system for rupturing a vacuum in a medical imaging device. The system includes a vacuum plug attached to the medical imaging device and configured to retain a vacuum in the medical imaging device. A puncture tool is configured to puncture the vacuum plug to rupture the vacuum in the medical imaging machine. A puncture tool retainer removably couples the puncture tool to the medical imaging device.

20 Claims, 4 Drawing Sheets

SYSTEMS FOR RUPTURING A VACUUM IN A MEDICAL IMAGING DEVICE

FIELD

The present disclosure generally relates to systems for rupturing a vacuum in a medical imaging device, and more particularly to point of use systems for rupturing a vacuum in a magnetic resonance imaging device.

BACKGROUND

Certain medical imaging devices, such as magnetic resonance or MR devices, require a vacuum for the magnetic components to function. The process of releasing or "quenching" the vacuum after use is completed is normally performed electronically, which deactivates the magnetic forces produced by the medical device. However, there is a requirement that manual backups are also provided for quickly quenching or breaking the vacuum vessel to quickly deactivate magnetic forces. In particular, the vacuum must be quickly broken in emergency situations in which a patient, equipment (i.e., an oxygen canister), and/or other personnel or objects become trapped or are otherwise unintentionally drawn magnetically to the medical imaging device. For example, emergency situations may arise through the accidental introduction of ferrous materials within proximity of the magnetic device during operation.

SUMMARY

This Summary is provided to introduce a selection of concepts that are further described below in the Detailed Description. This Summary is not intended to identify key or essential features of the claimed subject matter, nor is it intended to be used as an aid in limiting the scope of the claimed subject matter.

One embodiment of the present disclosure generally relates to a system for rupturing a vacuum in a medical imaging device. The system includes a vacuum plug attached to the medical imaging device and configured to retain a vacuum in the medical imaging device. A puncture tool is configured to puncture the vacuum plug to rupture the vacuum in the medical imaging machine. A puncture tool retainer removably couples the puncture tool to the medical imaging device.

Another embodiment generally relates to a system for rupturing a vacuum in a magnetic resonance imaging device. The system includes a vacuum plug configured to be coupled to the magnetic resonance imaging device. The vacuum plug has parallel outer and inner surfaces and perpendicularly defining a rupture passage therethrough. A puncture tool retainer receiver is also defined within the outer surface. A rupture disk sealingly covers the rupture passage defined within the vacuum plug to retain the vacuum in the magnetic resonance imaging device. A puncture tool extends from a handle to a puncture tip, the puncture tip being angled and configured to puncture the rupture disk when a force is applied via the handle by the puncture tip upon the rupture disk. A puncture tool retainer is receivable within the puncture tool retainer receiver such that the puncture tool retainer removably couples the puncture tool to the vacuum plug. The vacuum is ruptured when the rupture disk is punctured.

Another embodiment generally relates to a magnetic resonance imaging (MRI) device that includes a vacuum plug attached to a body of the MRI device and configured to retain a vacuum in the MRI device. A puncture tool is configured to puncture the vacuum plug to rupture the vacuum in the MRI device. A puncture tool retainer removably couples the puncture tool to the MRI device.

Various other features, objects and advantages of the disclosure will be made apparent from the following description taken together with the drawings.

BRIEF DESCRIPTION OF THE DRAWINGS

The present disclosure is described with reference to the following Figures.

DETAILED DISCLOSURE

As discussed above, magnetic resonance (MR) imaging devices require mechanisms to quickly break the vacuum to atmosphere in an emergency situation. In the context of medical devices in which patients may be involved, a manual mechanism for breaking this vacuum is required as a backup. The manual methods presently known in the art rely upon a vacuum breaking tool that is connectable to a vacuum rupture access point to perform this safety back up in the event of such emergency. Specifically, the vacuum break tool function opens the MR magnet vacuum vessel to atmosphere and disrupt the thermal performance used to maintain the super connecting capacity of the magnet, initiating the quench to cause loss of magnetic field.

While presently known vacuum breaking tools work when used correctly, the present inventor has identified that the effectiveness of these tools rely upon proper training of MRI facilities, field engineers, immediate medical personnel, and technicians being trained on the use of the tool. Moreover, the effectiveness of the tool relies upon the personnel in the immediate area knowing the whereabouts of the tool at all times. Following a recent study of the field, the present inventor has identified that the number of sites in which the emergency vacuum break tool was missing, or not immediately accessible, was cause for concern. Accordingly, the present inventor has developed a simpler, point of use system for rupturing a vacuum in a medical imaging device, replacing the problematic devices presently known in the art.

Figure 1:
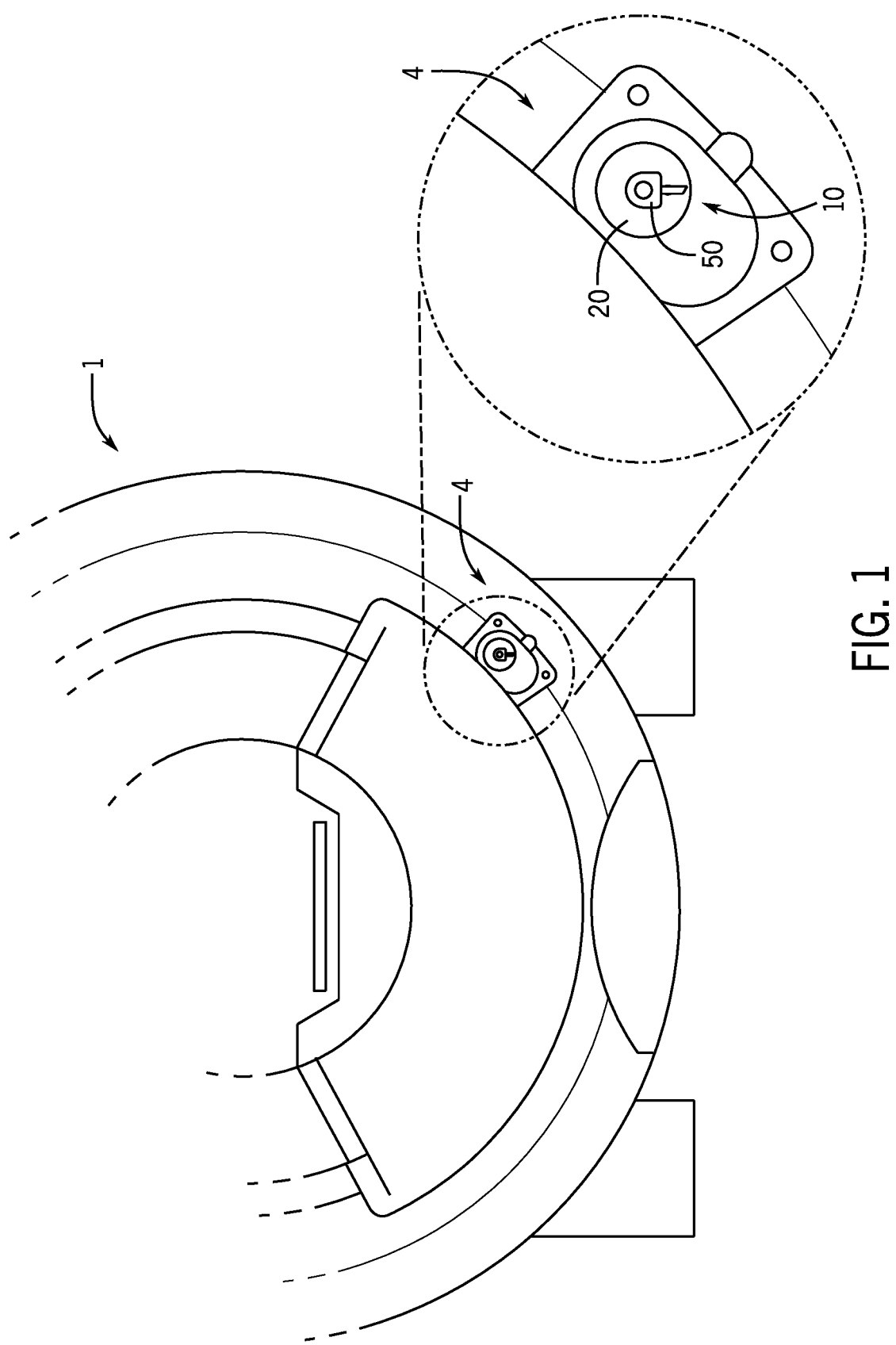
FIG. 1 is a front, close up view of a medical imaging device with a cover removed to reveal a system for rupturing a vacuum according to the present disclosure.

FIG. 1 shows one embodiment of a system 10 for rupturing a vacuum in a medical imaging device according to the present disclosure. In particular, FIG. 1 shows part of a magnetic resonance (MR) device 1 with a cover removed to reveal a vacuum rupture access point 4 as presently known in the art. However, in contrast to MR devices presently known in the art, the MR device 1 shown incorporates the presently disclosed system 10. The system 10 includes a novel vacuum plug 20 for sealing the vacuum vessel within the MR system 1, as well as the puncture tool 50 for rupturing the vacuum right at this point of use.

As shown in FIGS. 2-6, the vacuum plug 20 has an outer surface 22, an inner surface 23, and a side wall 28 extending therebetween. The side wall 28 includes coupling features 27 for sealingly coupling the vacuum plug 20 to the MR device 1 in a manner known in the art. These coupling procedures 27 provide that the vacuum plug 20 disclosed herewith may be retrofitted into MR devices 1 presently known in the art to seal the respective vacuum vessels therein.

Figure 5:
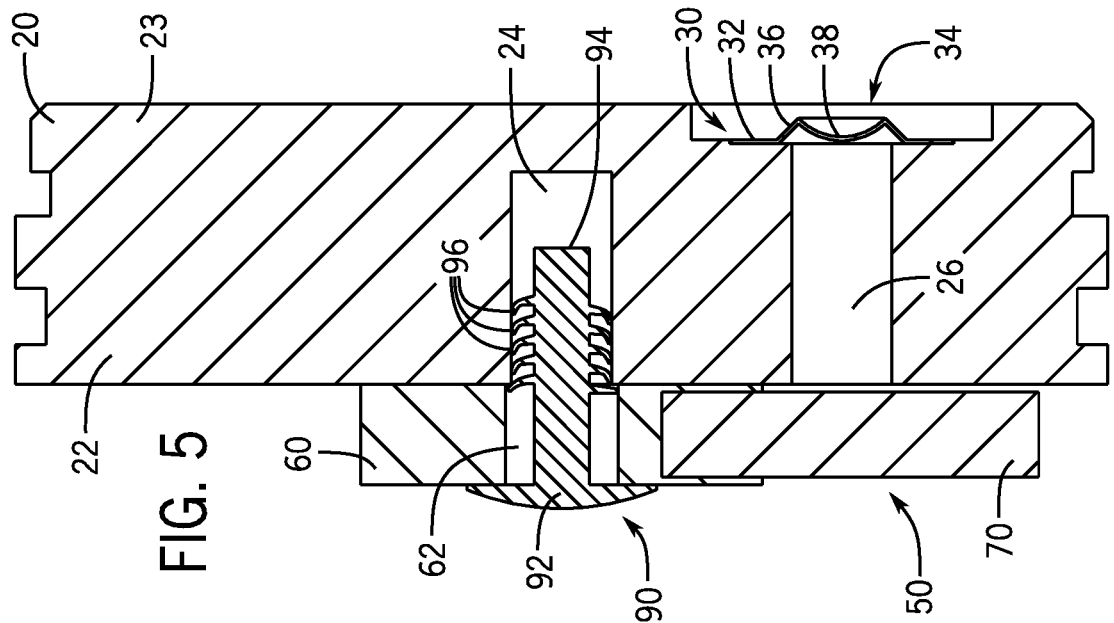
FIG. 5 is a sectional view taken along the line 5-5 of FIG. 4.

As shown in FIG. 5, the vacuum plug 20 defines a rupture passage 26 between the outer surface 22 and the inner surface 23. A rupture disk 30 is provided at the inner surface 23 of the vacuum plug 20 and provides a hermetic seal over the rupture passage 26 such that when the rupture disk 30 is intact, the vacuum plug 20 may maintain a vacuum within the MR device 1.

Figure 4:
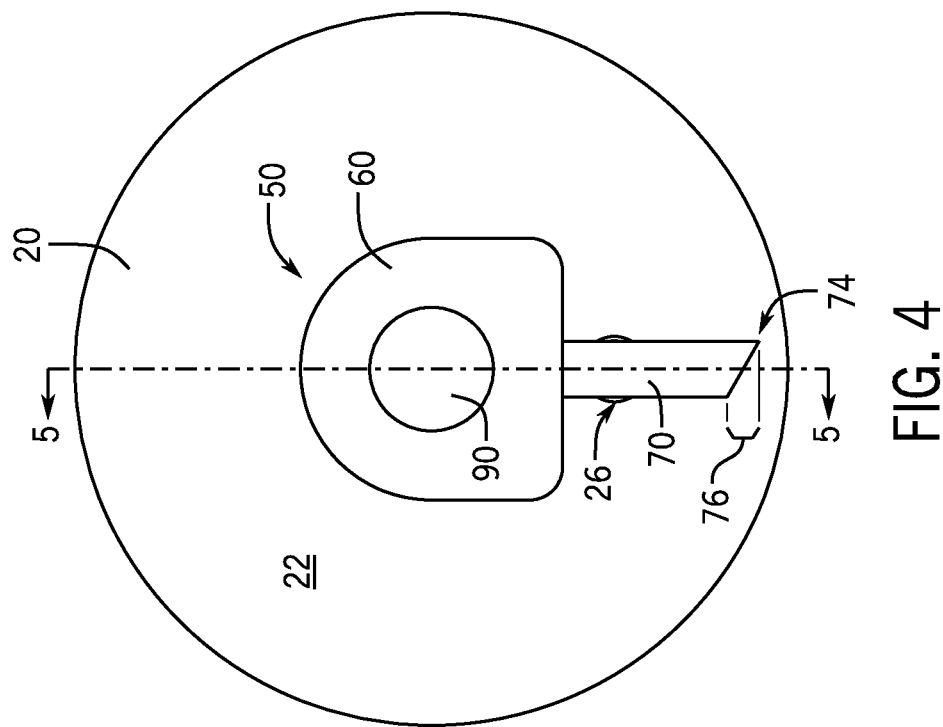
FIG. 4 is an upper view of the system shown in FIG. 2.

The system 10 further includes a puncture tool 50 configured to break the rupture disk 30 in a manner to be described further below. As shown in FIG. 4, the puncture tool 50 has a handle 60 and a puncture portion 70 that extends from the handle 60 to a puncture tip 74. In certain embodiments, the handle 60 is intended for a user to grip the puncture tool 50 to apply the force necessary for the puncture tip 70 to puncture the rupture disk 30 in the manner described further below.

In the embodiment shown in FIG. 4, the puncture portion 70 of the puncture tool 50 has an angled portion 76. Providing this angled portion 76 reduces the surface area in which forces applied to the puncture tool 50 are applied to the rupture disk 30 to assist in its rupture. Additionally or alternatively, the puncture tip 74 may be hollow such that it defines an opening 78 therein, further assisting in maximizing the force provided by the puncture tip 74 on the rupture disk 30.

Figure 3:
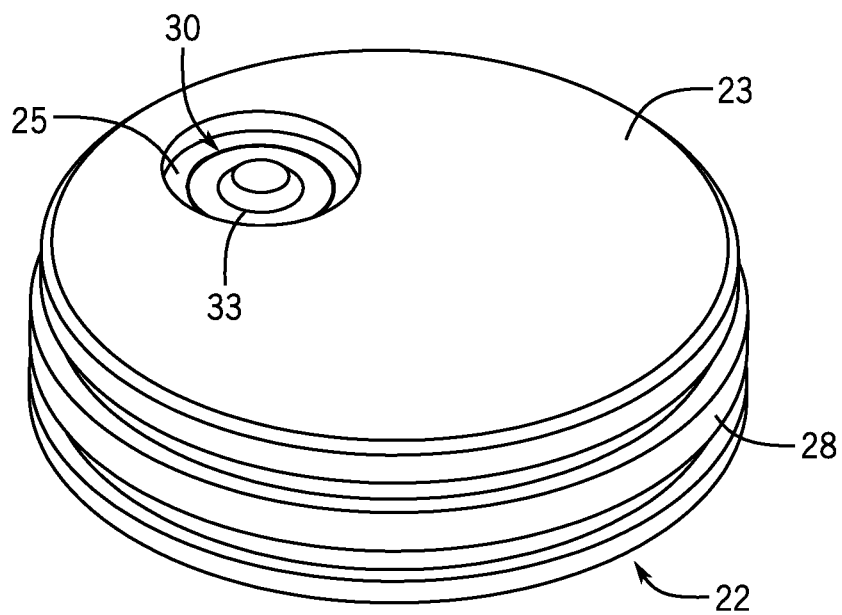

As best shown in FIG. 5, the rupture disk 30 is coupled to the inner surface 23 of the vacuum plug 20, in the present embodiment within a recess 25 defined therein. In the embodiment shown, the rupture disk 30 has a flange 32 for coupling to the inner surface 23 of the vacuum plug 20, such as by welding, adhesives, or other techniques known in the art. The rupture disk 30 includes a center portion 34, and in the present embodiment is a reverse buckling rupture disk. The center 34 includes a raised portion 36 and a convex portion 38 that extends towards the outer surface 22 of the vacuum plug 20. As shown in FIG. 3, the rupture disk 30 as presently depicted includes a score line 33, similar to that provided on the top of a soda can. The score line 33 further assists with the puncturing of the rupture disk 30, as well as defining where within the rupture disk 30 the puncturing occurs.

Figure 2:
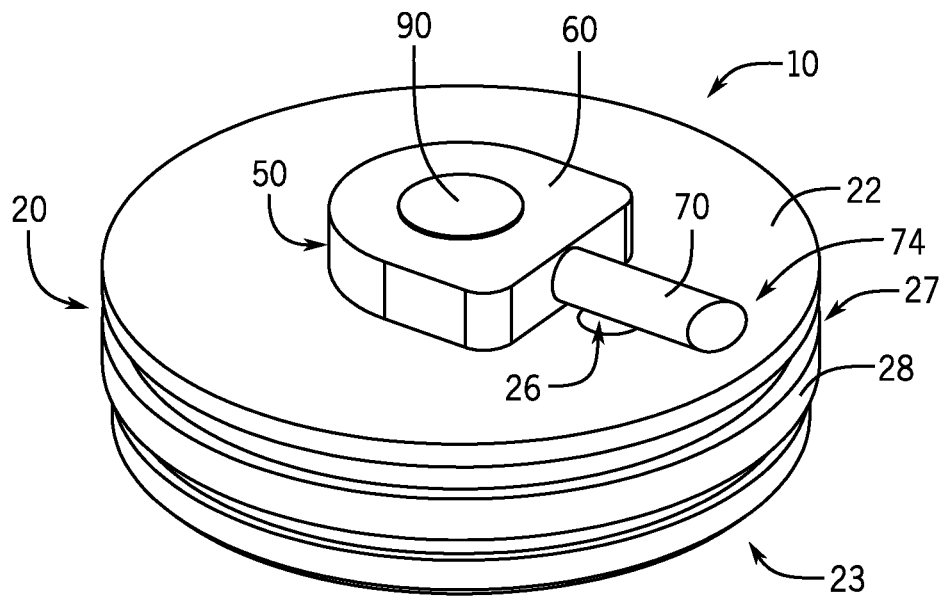
FIGS. 2 and 3 are isometric upper and lower views of the system shown in FIG. 1 removed from the medical imaging device.
Figure 6:
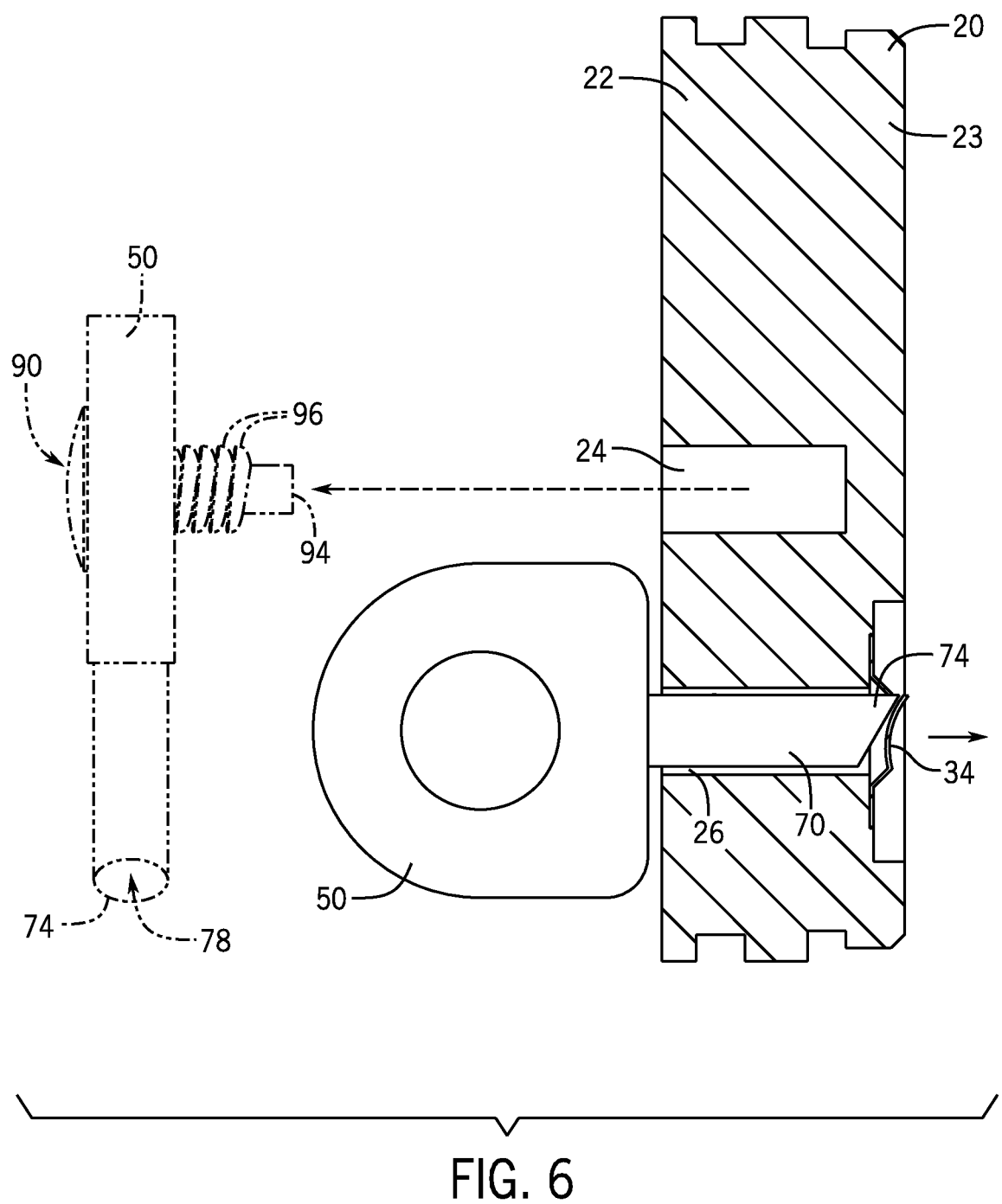
FIG. 6 is a sectional view similar to that shown in FIG. 5, now with the puncture tool removed and inserted to rupture the vacuum according to the present disclosure.

As discussed above, the present inventor has identified that no systems presently known in the art incorporate a puncture tool 50 at the point of use in conjunction with the vacuum plug 20. Instead, prior art tools are typically kept in storage closets, desks, or administrative areas away from the MR device 1. The system 10 presently disclosed provides a puncture tool retainer 90 that removably couples the puncture tool 50 directly to the vacuum plug 20. FIGS. 2 and 4-5 depict the puncture tool 50 retained on, or removably coupled to, the vacuum plug 20. FIG. 6 depicts the puncture tool 50 removed and actively puncturing the rupture disk 30 of the vacuum plug 20. In the embodiment shown, the puncture tool retainer 90 has a head 92 and extends to an inner point 94 with retention features 96, shown here as ribs, therebetween. The puncture tool retainer 90 is first received through a puncture tool retainer passthrough 62 defined within the handle 60 of the puncture tool 50, and then extends into a puncture tool retainer receiver 24 defined within the outer surface 22 of the vacuum plug 20. As best shown in FIG. 5, the retention features 96 are designed to engage with the puncture tool retainer receiver 24 to prevent removal of the puncture tool 50 from the vacuum plug 20. In the embodiment shown, the puncture tool retainer 90 is a Christmas tree type plug that retains the puncture tool 50 on the surface of the vacuum plug 20. In this manner, the puncture tool 50 is removable, without the use of tools, by applying a force away from the outer surface 22 to overcome the friction and/or other retention forces provided by the retention features 96. It should be recognized that the retention features 96 may also or alternatively include threads, a rotating lock system, or other methods for removably coupling the puncture tool 50 to the vacuum plug 20, which may be single-use or reinsertable, for example.

As best shown in FIG. 6, once the puncture tool 50 is removed from its storage position on the vacuum plug 20, it is rotated in a perpendicular orientation such that the puncture portion 70 of the puncture tool 50 may be inserted into the rupture passage 26 defined through the vacuum plug 20. As shown, the puncture tip 74 of the puncture tool 50 has punctured the rupture disk 30 along the score line 33 defined therein, which in certain embodiments does not completely encircle the center 34 of the rupture disk 30.

The present inventor has identified that a frustum reverse buckling (FRB) rupture disk as the rupture disk 30 provides particular advantages in being small, requiring low pressures to rupture, being readily available in the commercial market, and providing demonstrated reliable and accurate performance within aircraft, defense, automotive, and OEM industries. This type of rupture disk 30 further includes the benefits of being low cost, being designed for non-fragmentation upon puncture, having accurate and reliable burst ratings, providing full opening in either gas or liquid service, withstanding full vacuum, permitting small diameters, and having standard and custom holder designs readily available within the market.

Additionally, the present inventor has identified that the presently disclosed design 10 is advantageous in the context of an MR device 1 in that it creates no changes to the magnetic field and is not impacted by the magnetic field, has a low part count, provides mounting of the vacuum plug 20 and also the puncture tool 50 within a single, familiar location, and provides that the puncture tool 50 may be produced through inexpensive parts, including plastics and other polymers. Moreover, the puncture tool 50 is located at the point of use, but nonetheless remains hidden behind the current cover of the MR device 1. The system 10 further includes the benefits of having a low probability of inadvertent actuation, which destroys the magnet of the MR device 1 and must be reserved for use only in emergency circumstances.

The present inventor has conducted real world testing as confirmation of the system 10 functioning in an MR device 1. In the embodiment tested, 75 psi rupture disks 30 were used in conjunction with a puncture tool 50 having a 3/16" outer diameter puncture tip 74. The present inventor identified an average breaking force requirement of 8-10 pounds to puncture the rupture disk 30 when using a puncture tip 74 comprised of nylon 6/6. The use of nylon 6/6 was further advantageous over certain other materials in that it provided the necessary strength, which also being non-corrosive and thermally stabile from −40° C. to +55° C.

This written description uses examples to disclose the invention, including the best mode, and also to enable any person skilled in the art to make and use the invention.

Certain terms have been used for brevity, clarity, and understanding. No unnecessary limitations are to be inferred therefrom beyond the requirement of the prior art because such terms are used for descriptive purposes only and are intended to be broadly construed. The patentable scope of the invention is defined by the claims and may include other examples that occur to those skilled in the art. Such other examples are intended to be within the scope of the claims if they have features or structural elements that do not differ from the literal language of the claims, or if they include equivalent features or structural elements with insubstantial differences from the literal languages of the claims.

What is claimed is:

1. A system for rupturing a vacuum in a medical imaging device, the system comprising:
    a vacuum plug attached to the medical imaging device and configured to retain a vacuum in the medical imaging device;
    a puncture tool configured to puncture the vacuum plug to rupture the vacuum in the medical imaging machine; and
    a puncture tool retainer that removably couples the puncture tool to the medical imaging device.

2. The system according to claim 1, wherein the puncture tool retainer removably couples the puncture tool to the vacuum plug.

3. The system according to claim 2, wherein the vacuum plug defines a rupture passage therethrough, further comprising a rupture disk that sealingly covers the rupture passage to retain the vacuum in the medical imaging device, wherein the vacuum plug has an outer surface and an inner surface with the rupture passage defined therethrough, and wherein the rupture disk is coupled to the inner surface of the vacuum plug.

4. The system according to claim 3, wherein the puncture tool is configured to puncture the rupture disk inwardly, away from the outer surface.

5. The system according to claim 3, wherein the rupture disk is a reverse buckling rupture disk having a convex portion with a center extending towards the upper surface of the vacuum plug.

6. The system according to claim 1, wherein the puncture tool has a handle opposite a puncture tip, wherein a force is applied with the puncture tip via the handle to puncture the vacuum plug, wherein the handle defines a puncture tool retainer passthrough therein, wherein the vacuum plug defines a puncture tool retainer receiver therein, and wherein the puncture tool retainer extends through the puncture tool retainer passthrough and is received within the puncture tool retainer receiver to removably couple the puncture tool to the vacuum plug.

7. The system according to claim 6, wherein the puncture tool retainer is a Christmas tree type plug.

8. The system according to claim 6, wherein the puncture tool when removably coupled to the vacuum plug is perpendicular to when used to puncture the rupture disk.

9. The system according to claim 6, wherein the puncture tool retainer passthrough and the puncture tool retainer receiver are parallel when the puncture tool is removably coupled to the vacuum plug.

10. The system according to claim 6, wherein the puncture tip of the puncture tool is cylindrical and defines an opening therein.

11. The system according to claim 6, wherein the puncture tip is angled.

12. The system according to claim 1, wherein the puncture tool is non-metallic.

13. The system according to claim 1, wherein the medical imaging machine has a cover, and wherein the vacuum plug and the puncture tool are configured to be hidden from view by the cover when the puncture tool is removably coupled to the medical imaging device.

14. A system for rupturing a vacuum in a magnetic resonance imaging device, the system comprising:
    a vacuum plug configured to be coupled to the magnetic resonance imaging device, the vacuum plug having parallel outer and inner surfaces and perpendicularly defining a rupture passage therethrough, wherein a puncture tool retainer receiver is also defined within the outer surface;
    a rupture disk that sealingly covers the rupture passage defined within the vacuum plug to retain the vacuum in the magnetic resonance imaging device;
    a puncture tool extending from a handle to a puncture tip, the puncture tip being angled and configured to puncture the rupture disk when a force is applied via the handle by the puncture tip upon the rupture disk; and
    a puncture tool retainer receivable within the puncture tool retainer receiver such that the puncture tool retainer removably couples the puncture tool to the vacuum plug;
    wherein the vacuum is ruptured when the rupture disk is punctured.

15. The system according to claim 14, wherein the handle defines a puncture tool retainer passthrough therein, and wherein the puncture tool retainer extends through the puncture tool retainer passthrough and is received within the puncture tool retainer receiver to removably couple the puncture tool to the vacuum plug.

16. The system according to claim 15, wherein the puncture tool retainer passthrough and the puncture tool retainer receiver are parallel when the puncture tool is removably coupled to the vacuum plug, and wherein the puncture tool when removably coupled to the vacuum plug is perpendicular to when used to puncture the rupture disk.

17. A magnetic resonance imaging (MRI) device comprising:
    a vacuum plug attached to a body of the MRI device and configured to retain a vacuum in the MRI device;
    a puncture tool configured to puncture the vacuum plug to rupture the vacuum in the MRI device; and
    a puncture tool retainer that removably couples the puncture tool to the MRI device.

18. The MRI device of claim 17, wherein the puncture tool retainer removably couples the puncture tool to the vacuum plug, further comprising a removable cover that covers the vacuum plug.

19. The MRI device of claim 18, wherein the vacuum plug defines a rupture passage therethrough, further comprising a rupture disk that sealingly covers the rupture passage to retain the vacuum in the MRI device, wherein the vacuum plug has an outer surface and an inner surface with the rupture passage defined therethrough, and wherein the rupture disk is coupled to the inner surface of the vacuum plug.

20. The MRI device of claim 19, wherein the puncture tool extends from a handle to a puncture end, the puncture end being configured to puncture the rupture disk when a force is applied via the handle by the puncture tip upon the rupture disk, wherein the handle defines a puncture tool retainer passthrough therein, wherein the vacuum plug defines a puncture tool retainer receiver therein, and wherein the puncture tool retainer extends through the puncture tool retainer passthrough and is received within the puncture tool retainer receiver to removably couple the puncture tool to the vacuum plug.

* * * * *